US009583854B2

(12) United States Patent
Uesaka et al.

(10) Patent No.: US 9,583,854 B2
(45) Date of Patent: Feb. 28, 2017

(54) CONNECTOR AND SEMICONDUCTOR TESTING DEVICE HAVING THE SAME

(75) Inventors: Ryo Uesaka, Yamato (JP); Jun Watanabe, Yamato (JP); Akinori Mizumura, Yamato (JP); Hirotaka Wagata, Tokyo (JP)

(73) Assignees: Molex Japan Co., Ltd., Yamato (JP); Advantest Corporation, Tokyo (JP)

( * ) Notice: Subject to any disclaimer, the term of this patent is extended or adjusted under 35 U.S.C. 154(b) by 1023 days.

(21) Appl. No.: 13/105,548

(22) Filed: May 11, 2011

(65) Prior Publication Data

US 2011/0279140 A1    Nov. 17, 2011

(30) Foreign Application Priority Data

May 11, 2010  (JP) ................................. 2010-109655

(51) Int. Cl.

| G01R 31/00 | (2006.01) |
| H01R 12/71 | (2011.01) |
| G01R 1/04 | (2006.01) |
| H01R 24/50 | (2011.01) |
| G01R 31/28 | (2006.01) |

(52) U.S. Cl.
CPC ......... *H01R 12/714* (2013.01); *G01R 1/0416* (2013.01); *H01R 24/50* (2013.01); *G01R 31/2822* (2013.01)

(58) Field of Classification Search
CPC ..... G01R 1/0416; H01R 24/50; H01R 12/714
USPC .................................................. 324/756.05
See application file for complete search history.

(56) References Cited

U.S. PATENT DOCUMENTS

| 4,563,666 A * | 1/1986 | Borzoni ....................... 337/252 |
| 4,743,205 A | 5/1988 | Mitani et al. |
| 4,895,531 A * | 1/1990 | Vignoli ....................... 439/398 |
| 6,494,751 B1 * | 12/2002 | Morello et al. ............... 439/752 |

(Continued)

FOREIGN PATENT DOCUMENTS

| JP | H03-055322 | 10/1992 |
| JP | 3197862 | 7/1999 |

(Continued)

OTHER PUBLICATIONS

Faston Terminals Insulated and Uninsulated, p. 1-120, revised Mar. 2011, Catalog 82004, www.te.com, faston-terminals_-full_catalog_311.pdf.*

(Continued)

*Primary Examiner* — Thomas Valone
(74) *Attorney, Agent, or Firm* — Jeffrey K. Jacobs (57) ABSTRACT

To provide a connector wherein ground terminals can be designed easily, which not only suppresses the occurrence of impedance mismatch and crosstalk, but which does not lead to interferences between contacting portions. A ground terminal for a connector has a cylindrical main body. A plurality of contacting portions, for contacting a circuit board, are formed on the bottom edge of the cylindrical main body. The ground terminal has, as contacting portions, inner contacting portions and outer contacting portions. The inner contacting portions extend toward the inside of the cylindrical main body and in the downward direction, and the outer contacting portions extend toward the inside of the cylindrical main body and in the downward direction.

18 Claims, 10 Drawing Sheets

(56) References Cited

U.S. PATENT DOCUMENTS

| | | |
|---|---|---|
| 6,890,215 B2 | 5/2005 | Lang et al. |
| 7,086,867 B2 | 8/2006 | Nakagawa et al. |
| 7,766,662 B2 | 8/2010 | Akama et al. |
| 7,802,993 B2 | 9/2010 | Akama et al. |
| 7,850,488 B2 | 12/2010 | Ikegami et al. |

FOREIGN PATENT DOCUMENTS

| | | |
|---|---|---|
| JP | H10-186421 | 1/2000 |
| JP | 5050203 | 3/2009 |
| TW | 523204 | 3/2003 |
| TW | M287521 | 2/2006 |
| TW | 200919877 A | 5/2009 |

OTHER PUBLICATIONS

Tyco Electronics, Printed Circuit Board Terminals and Disconnects, p. 1-44, http://datasheet.octopart.com/3-770060-1-Tyco-Electronics-datasheet-5317555.pdf.*
Wagata, WO 2009/022398, Machine Translation, p. 1-40.*
Tyco Electronics, Faston Catalog 7-1713445-2, Jan., 2007, p. 1-48.*

* cited by examiner

CONNECTOR AND SEMICONDUCTOR TESTING DEVICE HAVING THE SAME

CROSS REFERENCE TO RELATED APPLICATIONS

The Present Disclosure claims priority to prior-filed Japanese Patent Application No. 2010-109655, entitled "Connector And Semiconductor Testing Device Having The Same," filed on 11 May 2010 with the Japanese Patent Office. The content of the aforementioned Patent Application is fully incorporated in its entirety herein.

BACKGROUND OF THE PRESENT DISCLOSURE

The Present Disclosure relates, generally, to a connector that can connect to a coaxial cable, and to a semiconductor testing device having such a connector, and, further, to technology for suppressing crosstalk and impedance mismatch.

Conventionally, connectors have been used for connecting coaxial cables to circuit boards. Such connectors typically have a plurality of ground terminals that make contact with shield lines in coaxial cables, and a plurality of signal terminals that make contact with signal lines of coaxial cables. Moreover, in such connectors, individual terminals are positioned facing upward so as to enable connection of the coaxial cables to the connector from above.

In Japanese Patent Application No. H03-055322 ("the '322 Application"), for example, a ground terminal, provided at an end portion of a coaxial cable (the "outer conductor 3") is formed in a cylindrical shape so as to encompass the signal terminal (the "inner conductor 2"), where the axis thereof is oriented so as to face the vertical upward direction relative to the substrate. A contacting portion for contacting conductors on the substrate is formed on the bottom edge of the ground terminal and the bottom end of the signal terminal. This contacting portion is spring-shaped, formed by a long and thin metal plate, where an improvement in the contact stability is achieved thereby.

SUMMARY OF THE PRESENT DISCLOSURE

As illustrated in the '322 Application, connectors have been considered wherein ground terminals have been formed in cylindrical shapes that encompass the signal terminal, and a spring-shaped contacting portion is formed at the lower edge of the ground terminal and at the lower end of the signal terminal. However, in the '322 Application, only a single ground contacting portion is provided for a single ground terminal, and thus the contacting portion of the signal terminal is not encompassed by the ground terminal. Accordingly, there is a tendency for impedance mismatch and crosstalk to occur in the vicinity of the contacting portions.

In regards to this problem, structures have been considered wherein the number of contacting portions for the ground terminal is increased and disposed so as to encompass the contacting portion of the signal terminal. However, when the number of contacting portions is increased, there is a tendency to produce interferences between the contacting portions. For example, in a structure wherein all of the contacting portions face toward the inside of a cylindrical ground terminal, there will be a tendency for there to be interferences between the contacting portions of the ground terminal, and for there to be interferences between the contacting portions of the ground terminal and the contacting portion of the signal terminal. Moreover, in structures wherein all of the contacting portions face to the outside of the cylindrical ground terminal, there is a tendency for there to be interferences between the contacting portions of two grounds terminals that are adjacent to each other.

The Present Disclosure is the result of contemplation on the problem described above. Accordingly, the object thereof is to provide a contact, and a semiconductor testing device utilizing such a contact. Consequently, the Present Disclosure presents a device able to suppress impedance mismatch and crosstalk, wherein terminals can be designed easily so as to not have a tendency for interferences between the contacting portions.

In order to solve the problem set forth above, the connector according to the Present Disclosure comprises a plurality of ground terminals, each having a cylindrical main body, disposed on a circuit board so that the axes of the cylindrical main bodies face in a direction that is perpendicular relative to the circuit board. Further, the Present Disclosure comprises a plurality of signal terminals that are disposed on the inside of respective cylindrical main bodies. Each individual ground terminal has a plurality of contacting portions for contacting the circuit board, wherein the plurality of contacting portions extend from the bottom edges of the cylindrical main bodies. Each ground terminal comprises, as a plurality of contacting portions, an inner contacting portion that extends toward the inside of the cylindrical main body and in the downward direction, and an outer contacting portion that extends toward the outside of the cylindrical main body and in the downward direction.

In the Present Disclosure, the ground terminals have a plurality of contacting portions, suppressing the impedance mismatch and crosstalk. Additionally, the ground terminals have, as a plurality of contacting portions, inner contacting portions that extend toward the inside of the cylindrical main body, and outer contacting portions that extend toward the outside of the cylindrical main body. Because of this, design of grounds terminals wherein the contacting portions do not produce interferences can be performed more easily. Note that the "downward direction" indicated herein refers to a relative direction relative to the circuit board. That is, the "downward direction" means the direction facing the surface of the circuit board.

Further, in the outer contacting portion, the line in the direction of extension of the outer contacting portion may be formed so as to pass through the outside of the cylindrical main body of an adjacent ground terminal. Doing so makes it possible to prevent the outer contacting portion from contacting the adjacent ground terminal, making it possible to reduce the distance between two adjacent ground terminals.

Further, each of the ground terminals may include two outer contacting portions. Moreover, the two outer contacting portions may be formed so that so that the adjacent ground terminal is located between two lines in the direction of extension of the two outer contacting portions. Doing so enables the distance between two adjacent grounds terminals to be reduced while simultaneously increasing the number of outer contacting portions. Note that the number of outer contacting portions is not limited to two.

Further, each of the ground terminals may include two inner contacting portions, where the two inner contacting portions and the two outer contacting portions may be disposed so as to encompass the signal terminal. Doing so enables the suppression of impedance mismatch and crosstalk. Note that the number of internal contacting portions is also not limited to two.

Further, the two inner contacting portions and the two outer contacting portions may pass through the center of the cylindrical main body, and maybe positioned on mutually opposite sides of a plane perpendicular to the direction in which the plurality of ground terminals is lined up, where the signal terminal may have, on the bottom end thereof, a contacting portion for contacting the circuit board, where the contacting portion of the signal terminal may be positioned on the opposite side of the plane from the two inner contacting portions. Doing so makes it possible to adequately extend the contacting portion for the signal terminal while preventing contact between the inner contacting portions and the contacting portion of the signal terminal.

Note that in order to solve the problem set forth above, a semiconductor testing device according to the Present Disclosure is provided with the aforementioned connector and the aforementioned circuit board. According to the Present Disclosure, the ground terminals have a plurality of contacting portions, suppressing impedance mismatch and crosstalk. Additionally, the ground terminals have, as a plurality of contacting portions, inner contacting portions that extend toward the inside of the cylindrical main body and outer contacting portions that extend toward the outside of the cylindrical main body. Because of this, design of ground terminals where in interferences do not occur between the contacting portions can be performed more easily.

Further, in the semiconductor testing device according to the Present Disclosure, the signal terminal may have, at the lower end thereof, a contacting portion for contacting the circuit board, and each individual ground terminal may have two inner contacting portions and two outer contacting portions. Furthermore, a conductive pattern for contacting the contacting portion of the signal terminal, and a conductive pattern for contacting the two outer contacting portions and the two inner contacting portions, formed encompassing the signal conductive pattern, may be formed on the surface of the circuit board. Thus, the contacting portion of the signal terminal can be encompassed by the two inner contacting portions and the two outer contacting portions, enabling suppression of the impedance mismatch and the crosstalk. Additionally, the conductive pattern that contacts the inner contacting portions and the outer contacting portions (that is, the ground conductive pattern) encompasses the conductive pattern that contacts the contacting portion for the signal terminal (that is, the signal propagation conductive pattern), and thus it is possible to achieve excellent impedance matching even on the circuit board. Note that the number of inner contacting portions or outer contacting portions is not limited to two.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Further, note that in the Present Disclosure, the perpendicular direction relative to the circuit board 90 to which the connector 1 is attached is defined as the vertical direction, and the direction in which the circuit board 90 is positioned relative to the connector one is downward. Also, the direction wherein the plurality of terminals 3 and 4 are lined up (that is, the direction indicated by X1-X2 in FIG. 1) is the left/right direction, where the direction that is perpendicular to both the left/right direction and the vertical direction (that is, the direction indicated by Y1-Y2 in FIG. 1) is defined as the front/back direction.

Figure 1:
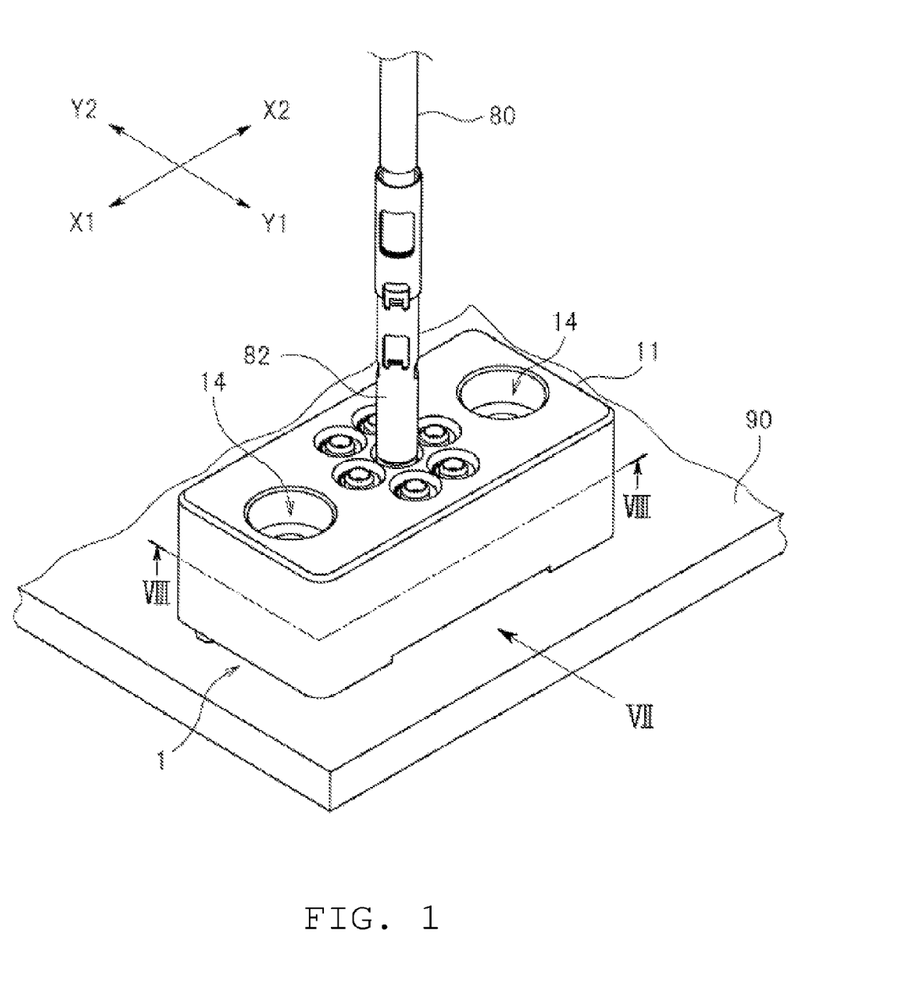
FIG. 1 is a perspective view of a connector according to the Present Disclosure.

As illustrated in FIG. 1, the connector 1 is disposed on a circuit board 90 at the time of use. Additionally, the end portion of a coaxial cable 80 is inserted into the connector 1 from above. The coaxial cable 80 has a signal line and a cylindrical shield line (both not shown), encompassing the signal line. Moreover, as in FIG. 3, the coaxial cable 80 has a signal terminal 81 in the form of a pin positioned at the end portion of the signal line, and a shield terminal 82 that is formed surrounding the signal terminal 81, positioned at the end portion of the shield line.

Figure 2:
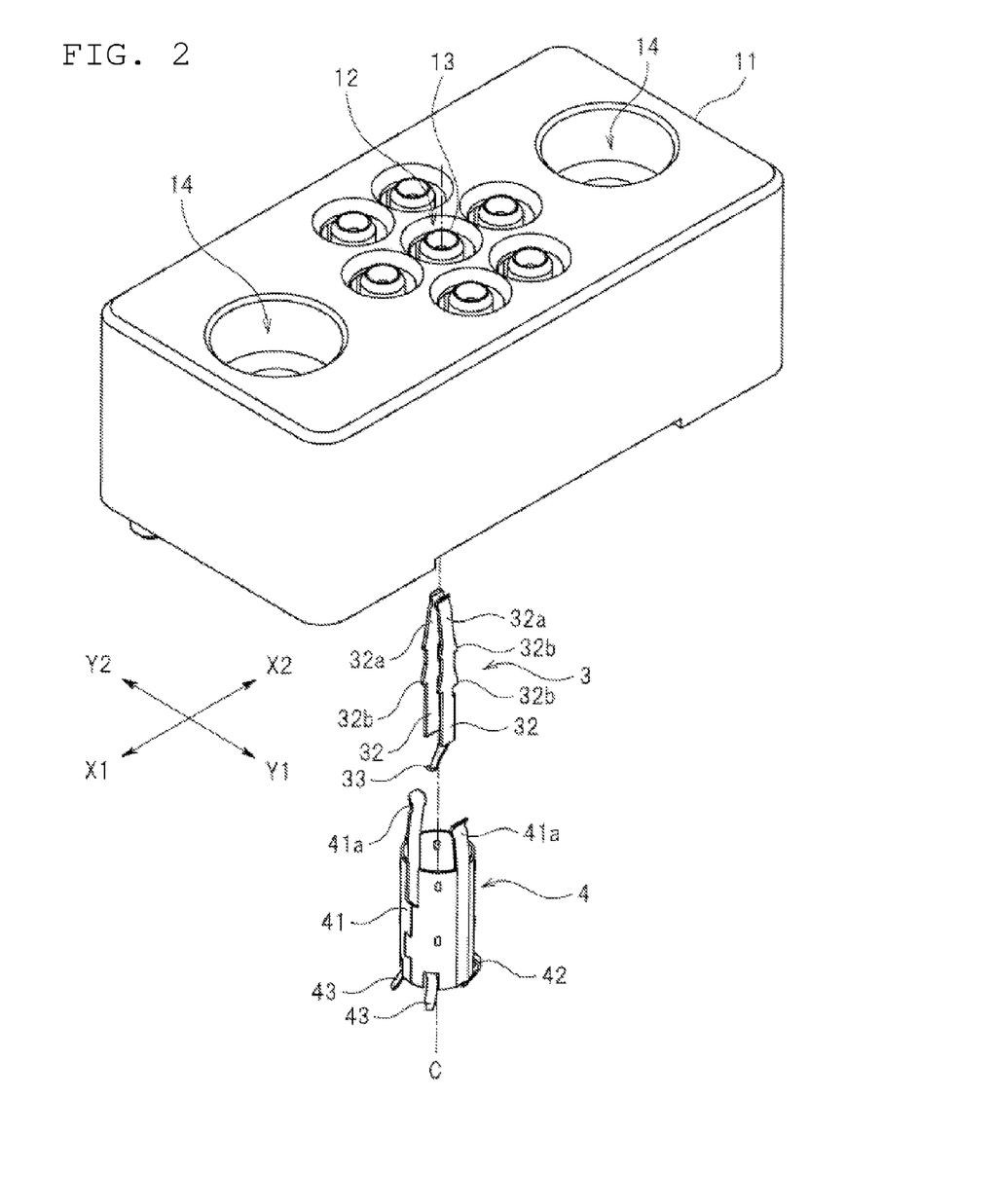
FIG. 2 is a perspective assembly view of the connector of FIG. 1, where the connector is shown from an upper oblique.
Figure 3:
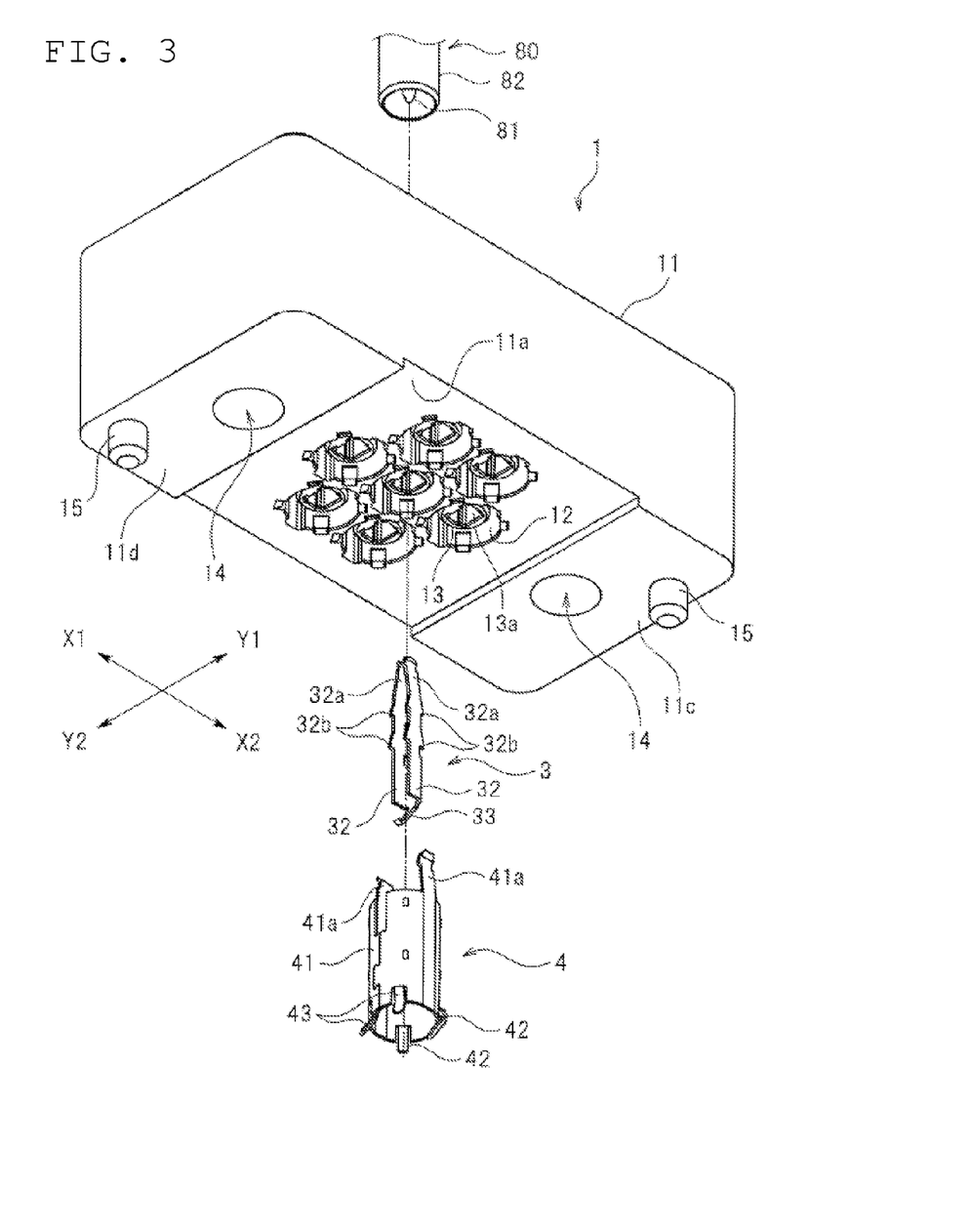
FIG. 3 is a perspective assembly view of the connector of FIG. 1, where the connector is shown from an lower oblique.

As illustrated in FIGS. 2-3, the connector 1 has a plurality of signal terminals 3 and a plurality of ground terminals 4. When the end portion of the coaxial cable 80 is inserted into the connector 1, the signal terminal 3 contacts the signal terminal 81 of the coaxial cable 80, to connect electrically to the signal line. The ground terminal 4 contacts the shield terminal 82 of the coaxial cable 80, to connect electrically with the shield line.

Figure 4:
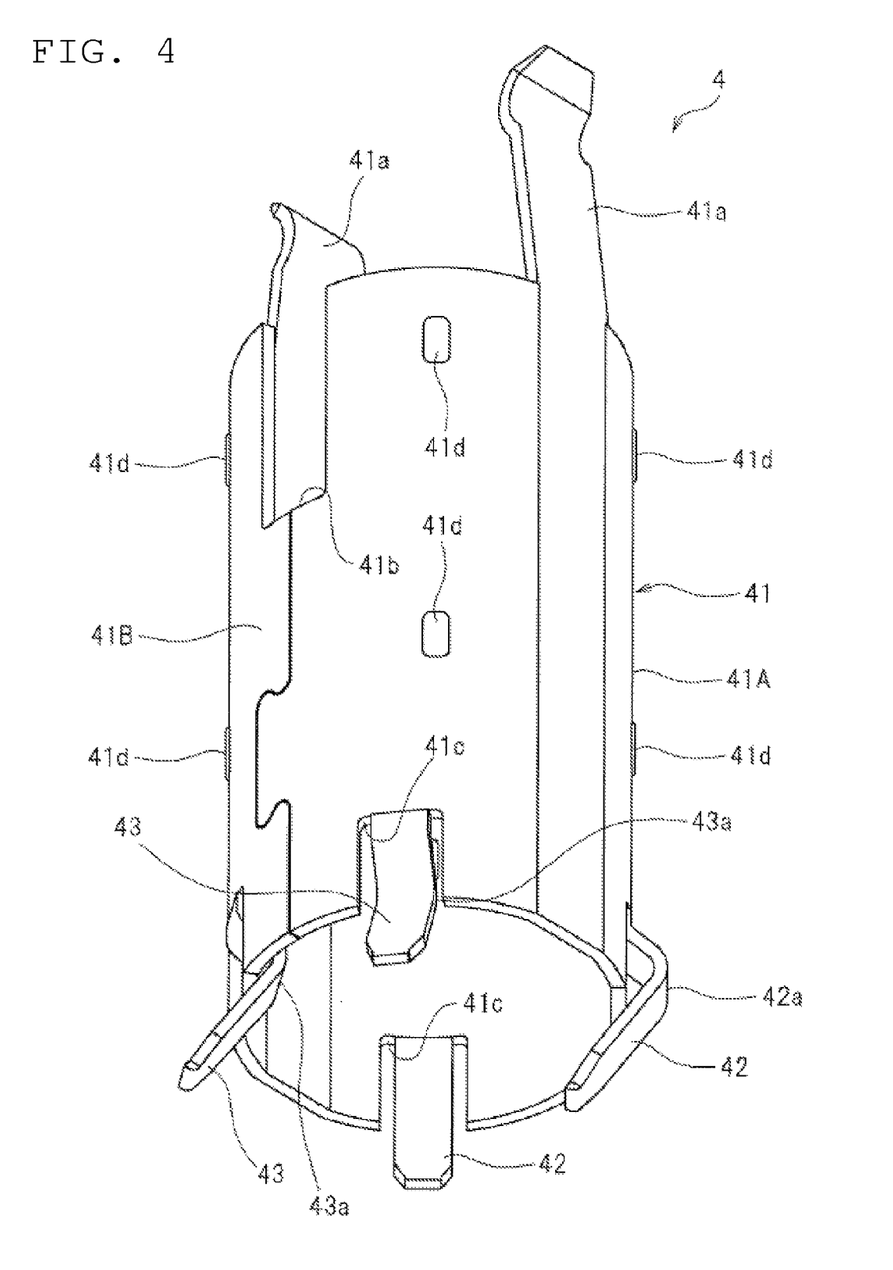
FIG. 4 is a perspective view of a ground terminal having the connector of FIG. 1.

As illustrated in FIG. 2-FIG. 4, the ground terminal 4 has a cylindrical main body 41. When the connector 1 is used, the cylindrical main body 41 is disposed so that the axis (the center line) C thereof faces in the perpendicular direction relative to the circuit board 90 (which, in this case, is the vertical direction). That is, the cylindrical main body 41 is positioned so as to stand erect on the circuit board 90. In this present example, the ground terminal 4 is a member that is formed through performing press machining or the like on a metal plate. The cylindrical main body 41 has an essentially ring-shaped cross section (see FIG. 5). The cylindrical main body 41 has two contacting portions 41a that are formed as long leaf springs that extend upward from the upper edge portion thereof (that is, in the direction facing the surface of the circuit board 90 to which the connector 1 is attached). The two contacting portions 41a are formed so as to face each other in the front/back direction (the Y1-Y2 direction). Additionally, the two contacting portions 41a are inclined relative to the axis C of the cylindrical main body 41 so as to gradually reduce the gap therebetween the closer to the top ends thereof. When a coaxial cable 80 is inserted into the connector 1, the shield terminal 82 is inserted between the two contacting portions 41a, where the contacting portion 41a grasps the outer peripheral surface of the shield terminal 82. Additionally, the ground terminal 4 has a plurality of contacting portions 42 and 43 that are connected electrically to the conductive pattern 92 of the circuit board 90. These contacting portions 42 and 43 will be explained in detail below.

Figure 5:
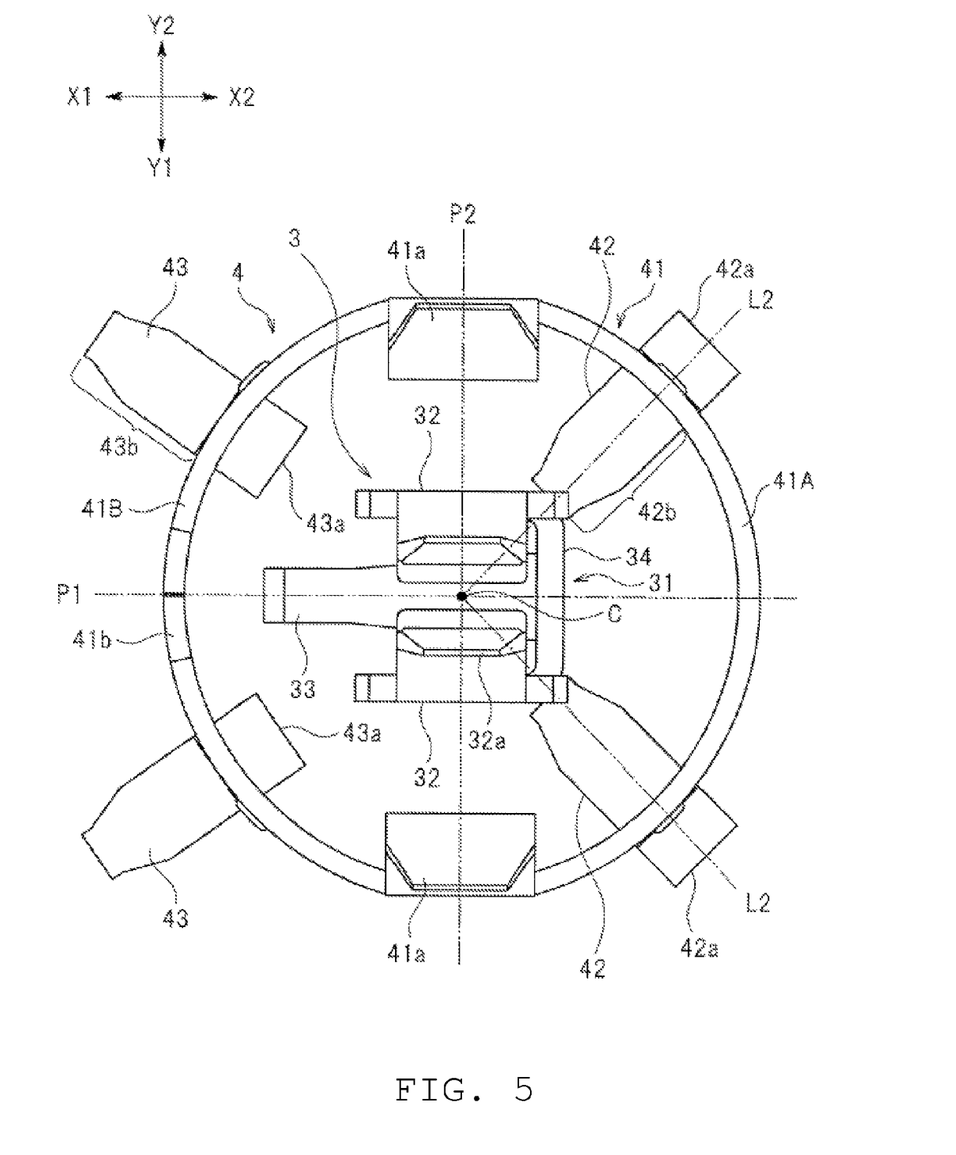
FIG. 5 is a plan view of signal and ground terminals using the connector of FIG. 1.

The signal terminal 3 is positioned to the inside of the cylindrical main body 41 of the ground terminal 4, and is formed so as to extend in the vertical direction. As illustrated in FIG. 5, the main body of the signal terminal 3 (the "signal terminal main body 31"), located on the inside of the cylindrical main body 41, has an essentially U-shaped cross-sectional shape that surrounds a centerline C of the cylindrical main body 41. Specifically, the signal terminal main body 31 has a base wall portion 34 that is formed in the shape of a plate facing the left/right direction and a pair of sidewall portions 32 that face each other in the front/back direction. The sidewall portions 32 each connected to respective edges of the base wall portion 34.

As illustrated in FIG. 2-FIG. 3, each of the sidewall portions 32 has, in the upper portion thereof, a contacting portion 32a. Each of the contacting portions 32a is formed as a leaf spring shape, which face each other in the front/back direction. Additionally, the two contacting portions 32a are inclined toward the center line C so that the gap therebetween becomes narrower the further toward the top ends there up. When the coaxial cable 80 is inserted into the connector 1, the signal terminal 81 is inserted between the two contacting portions 32a, and the contacting portions 32a grips the signal terminal 81.

Figure 7:
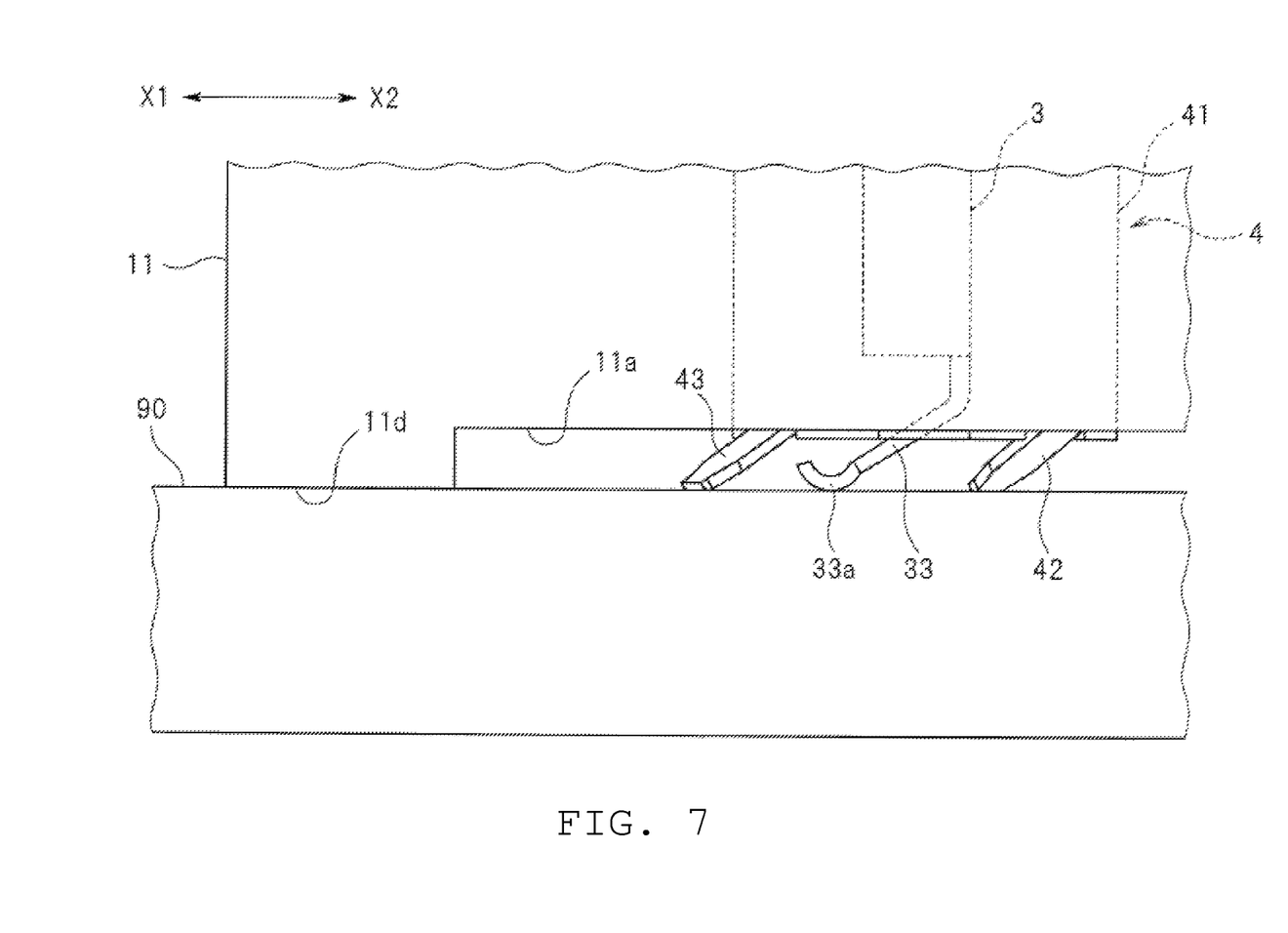
FIG. 7 is a side view of the connector of FIG. 1 (facing the connector in the direction illustrated by Arrow VII in FIG. 1)

As illustrated in FIG. 3, 5 or 7, the signal terminal 3 has, at the lower end thereof, a contacting portion 33. The contacting portion 33 is structured as a long and thin plate-shaped spring that extends obliquely downward, and makes contact with the conductive pattern 91 for signal propagation, which is formed on the surface of the circuit board 90. In this example, the contacting portion 33 extends downward from the bottom end of the base wall portion 34, and is angled to either the left or the right side (which, in this direction, is angled toward the left).

When the connector 1 is attached to the circuit board 90, the tip end of the contacting portion 33 contacts the conductive pattern 91. At this time, the contacting portion 33 elastically deforms upward with the base portion thereof as the fulcrum. In addition, the contacting portion 33, through that elastic force, pushes the tip end 33a against the conductive pattern 91. Note that, as illustrated in FIG. 7, the tip end 33a of the contacting portion 33 is curved so as to bulge downward, and the bottom face of the curved tip end 33a contacts the conductive pattern 91.

Figure 6:
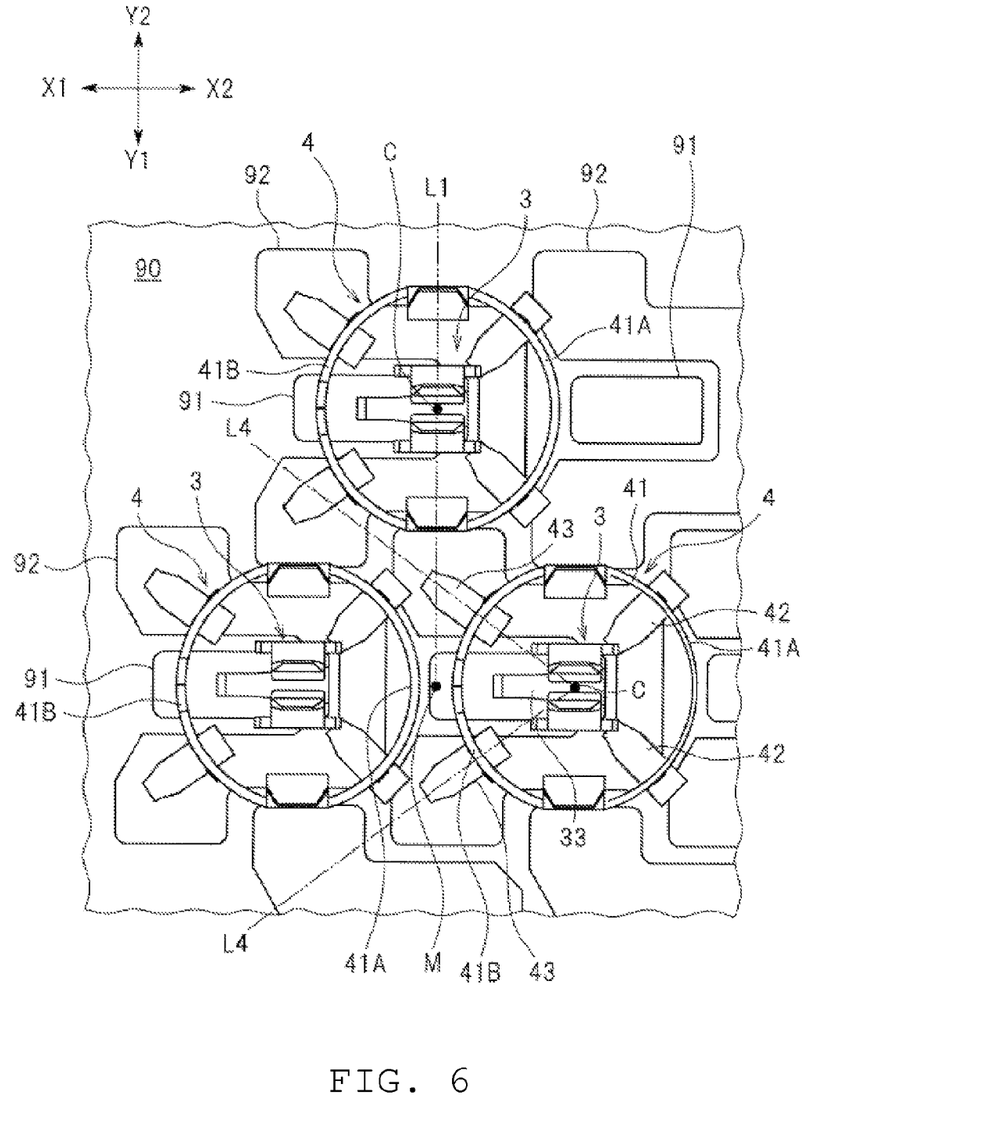
FIG. 6 is a plan view of a circuit board to which the signal terminal of FIG. 5, the ground terminal of FIG. 5 and the connector of FIG. 1 are attached.

As illustrated in FIGS. 6-7, even when the connector 1 is attached to the circuit board 90 and the contacting portion 33 is elastically deformed, the tip end 33a of the contacting portion 33 is positioned toward the inside of the cylindrical main body 41, when looking at the connector 1 as a plan view. That is, the length of the contacting portion 33 is set so that the tip end 33a is positioned to the inside of the cylindrical main body 41 even when the connector 1 is attached to the circuit board 90.

As illustrated in FIGS. 2-3, the connector 1 has a housing 11 that is formed from an insulating material. In this example, the housing 11 is an essentially rectangular member. A plurality of retaining holes 12 that pass through the housing in the vertical direction of is formed in the housing 11. The ground terminals 4 are pressed into the individual retaining holes 12 on the bottom, and the cylindrical main bodies 41 of the ground terminals 4 are held within the retaining holes 12.

Figure 8:
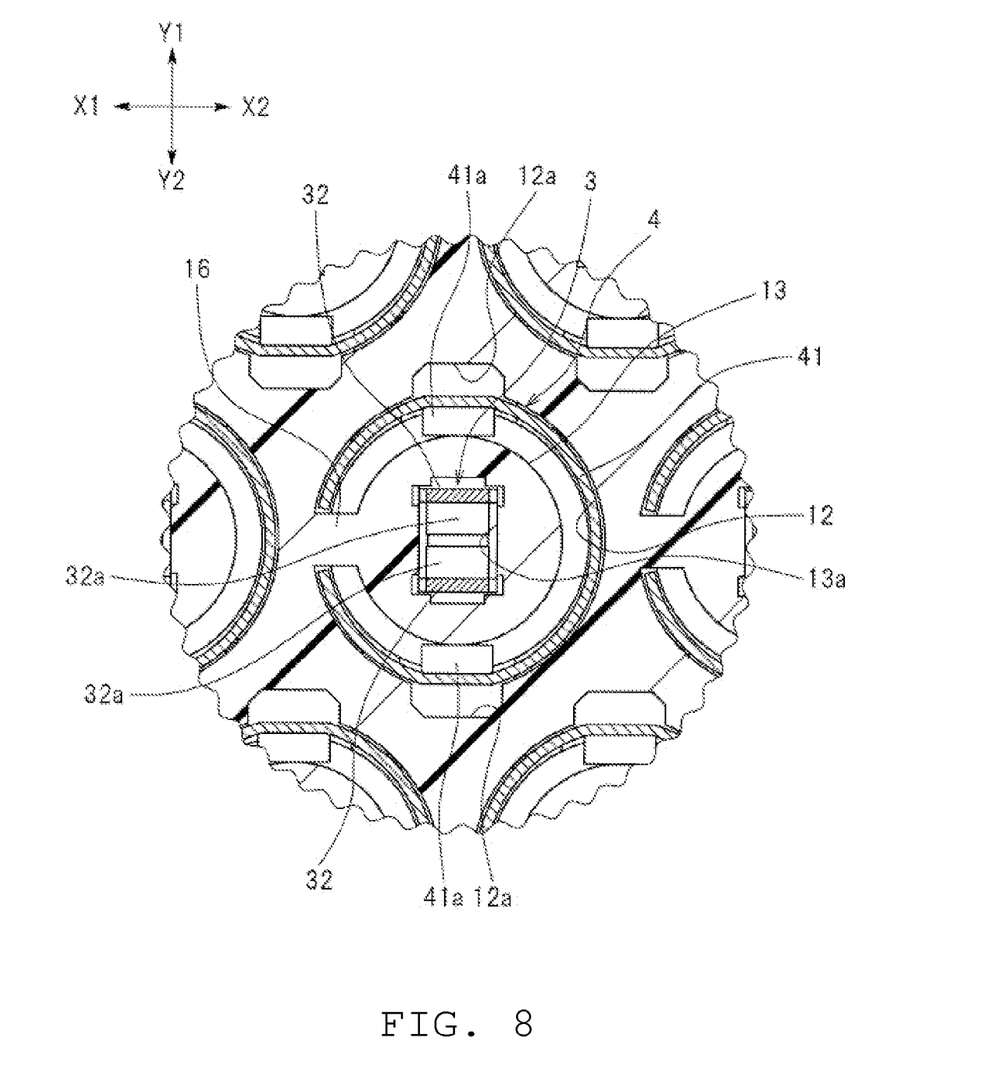
FIG. 8 is a side view of the connector of FIG. 1 along Section VIII-VIII shown in FIG. 1.

As illustrated in FIG. 8, the retaining hole 12 is essentially circular, with the inner diameter thereof corresponding to the outer diameter of the cylindrical main body 41. Changes in orientation of the cylindrical main body 41 within the retaining hole 12 are controlled thereby. Additionally, as illustrated in FIG. 4, a plurality of raised portions 41d that protrude to the outside in the radial direction is formed on the outer peripheral surface of the cylindrical main body 41. When the ground terminal 41 is pressed into the retaining hole 12 from the bottom, the raised portions 41d press against the inner surface of the retaining hole 12. This makes it possible to support the orientation of the cylindrical main body 41 within the retaining hole 12 more securely. Note that, as illustrated in FIG. 8, grooves 12a that extend in the vertical direction are formed in the inner surface of the retaining hole 12. The grooves 12a are positioned on the outside of the contacting portion 41a. This prevents the contacting portion 41a from contacting the inner surface of the retaining hole 12 when the contacting portion 41a deforms elastically.

As illustrated in FIG. 8, the housing 11 has essentially cylindrical retaining portions 13 that are positioned within each of the retaining holes 12. Holes 13a that pass through the retaining portions 13 in the vertical direction are formed in the retaining portions 13. The signal terminal 3 is pressed, from the bottom, into the hole 13a that is formed in the retaining portion 13, and is held by the retaining portion 13. In this example, as illustrated in FIG. 2, catch portions 32b are formed on the left and right edges of the sidewall portions 32 of the signal terminal 3. The catch portions 32b catch on the inner surfaces of the hole 13a in the retaining portion 13, and the signal terminal 3 is retained within the retaining hole 13 thereby.

Note that, as illustrated in FIG. 8, the housing 11 has a connecting portion 16 that supports the retaining portion 13 within the retaining hole 12, connecting the outer peripheral surface of the retaining portion 13 and the inner surface of the retaining hole 12. As illustrated in FIG. 4, a recessed portion 41b, which extends downward, is formed in the top edge of the cylindrical main body 41 of the ground terminal 4. When the ground terminal 4 is inserted into the retaining hole 12, the connecting portion 16 fits into the recessed portion 41b. This controls the rotation of the ground terminal 4 within the retaining hole 12.

As illustrated in FIG. 1, a plurality of retaining holes 12 is lined up in the left/right direction. In the present example, the retaining holes 12 are lined up in the left-right direction in a plurality of rows. Because of this, the ground terminals 4 and the signal terminals 3 that are disposed within the retaining holes 12 are also lined up in the left/right direction in a plurality of rows. As illustrated in FIG. 6, the ground terminals 4 that are positioned in two adjacent rows are positioned alternatingly in the left/right direction. That is, the center line C of a ground terminal 4 of an adjacent row is positioned on a line L1 that is perpendicular to the direction in which the ground terminals 4 are lined up (in this case, the left/right direction) and that passes through the middle position M between two adjacent ground terminals 4 that are both on the same row.

As illustrated in FIGS. 2-3, attaching holes 14 for securing the housing 11 to the circuit board 90 are formed in the housing 11. In the present example, the attaching holes 14 pass through the housing 11 in the vertical direction, where the housing 11 is secured to the circuit board 90 through securing hardware, such as rivets, screws, or plastic pins, that is inserted into the attaching holes 14. Two attaching holes 14 are formed in the housing 11, and a plurality of retaining holes 12 are formed therebetween. Note that, as illustrated in FIG. 3, a plurality of raised portions 15 is formed on the bottom surface of the housing 11. On the other hand, holes are formed in the circuit board 90. The position of the connector 1 in the circuit board 90 is controlled by the raised portions 15 fitting into the holes in the circuit board 90.

Note that, as illustrated in FIG. 3, a recessed portion 11a is formed on the bottom surface of the housing 11. The retaining holes 12 are positioned in this recessed portion 11a. The tip ends 33a of the contacting portions 33 of the signal terminals 3 and the tip ends of the contacting portions 42 and 43 of the ground terminals 4, described below, are formed so as to protrude from the bottom surface of the recessed portion 11a, positioned at positions that are lower than those of the right side portion 11c and the left side portion 11d of the bottom surface of the housing 11. When the connector 1 is attached to the circuit board 90, the tip end 33a of the contacting portion 33 of the signal terminal 3, and the tip ends of the contacting portions 42 and 43 of the ground terminal 4, as illustrated in FIG. 7, contact the conductive pattern of the circuit board 90, while, in addition, the right side portion 11c and the left side portion lid of the bottom surface of the housing also contact the circuit board 90.

As described above, the individual ground terminal 4 has a plurality of contacting portions 42 and 43 connected electrically to the conductive pattern 92 using the ground of the circuit board 90. As illustrated in FIG. 4, the contacting portions 42 and 43 are formed in the shape of leaf springs that extend downward at an angle from the bottom edge of the cylindrical main body 41. Moreover, the contacting portions 42 and 43 are disposed separated from each other in the circumferential direction of the cylindrical main body 41. In other words, the contacting portions 42 and 43 extend from positions that are separate from each other on the bottom edge of the cylindrical main body 41. In the present example, four cutouts 41c that extend in the upward direction are formed on the bottom edge of the cylindrical main body 41. These cutouts 41c are lined up with essentially equal spacing around the circumferential direction of the cylindrical main body 41. The contacting portions 42 and 43 extend from the top edges of the cutouts 41c, and thus the base portions of the contacting portions 42 and 43 are disposed with essentially equal spacing in the circumferential direction of the cylindrical main body 41. Additionally, the contacting portions 42 and 43 encircle the contacting portion 33 of the signal terminal 3. Further, the ground terminal 4 have, as the contacting portions 42 and 43, two inner contacting portions 42 and two outer contacting portions 43.

As illustrated in FIG. 5, the tip end of the inner contacting portion 42 extends toward the inside of the cylindrical main body 41 and in the downward direction. That is, the inner contacting portion 42 extends in an oblique downward direction facing toward the inside in the radial direction of the cylindrical main body 41. Because of this, in the plan view of the connector 1, the inner contacting portions 42 are positioned to the inside of the cylindrical main body 41. In this example, the line L2 that extends in the direction of extension of the inner contacting portion 42 passes through the center line C of the cylindrical main body 41. Additionally, the two inner contacting portions 42 are formed to not only include the center line C of the cylindrical main body 41, but also to be symmetrical, with a plane P1 that is parallel to the left/right direction interposed therebetween.

As illustrated in FIG. 5, the tip end of the outer contacting portion 43 extends toward the outside of the cylindrical main body 41 and in the downward direction. That is, the outer contacting portion 43 extends in an oblique downward direction facing toward the outside in the radial direction of the cylindrical main body 41. Because of this, in the plan view of the connector 1, the outer contacting portions 43 are positioned to the outside of the cylindrical main body 41. The two outer contacting portions 43, as with the inner contacting portions 42, not only include the center line C of the cylindrical main body 41, but are also symmetrical, with a plane P1 that is parallel to the left/right direction interposed therebetween. Additionally, the inner contacting portions 42 and the outer contacting portions 43 are positioned on opposite sides from each other with the center line C of the cylindrical main body 41 therebetween.

As illustrated in FIG. 5, the inner contacting portion 42 and the outer contacting portion 43 are positioned on initially opposite sides of the plane P2 that is perpendicular to the left/right direction (that is, the direction wherein the plurality of ground terminals 4 is lined up), and including the center line C of the cylindrical main body 41. In this example, the two inner contacting portions 42 are formed in a right side portion 41A of the cylindrical main body 41 (which is the portion on the right side of the plane P2, and which will be termed the "first half cylinder portion") and the two outer contacting portions 43 are formed in a left side portion 41B of the cylindrical main body 41 (which is the portion on the left side of the plane P2, and which will be termed the "second half cylinder portion"). The first half cylinder portion 41A, and the second half cylinder portion 41B of the adjacent ground terminal 4 face each other in the left/right direction. Note that, as illustrated in FIG. 5, the center of the width of the contacting portion 41a that is formed in the code 41 is positioned on the plane P2. Similarly, the center of the width of the contacting portion 32a of the signal terminal 3 is positioned on the plane P2.

As illustrated in FIG. 6, in the outer contacting portion 43, a line L4 that extends in the direction of extension of the outer contacting portion 43 is formed so as to pass to the outside of the cylindrical main body 41 of the adjacent ground terminal 4 lined up in the same row. Moreover, the ground terminal 4 that is adjacent and lined up in the same row is positioned between two lines L 4 that extend in the direction of extension of the two outer contacting portions 43.

When the connector 1 is attached to the circuit board 90, the tip ends of the inner contacting portions 42 and the outer contacting portions 43 contact the conductive pattern 92. Because the inner contacting portions 42 and the outer contacting portions 43 are shaped as leaf springs, when the connector 1 is attached to the circuit board 90, the contacting portions 42 and 43 deform elastically upward with the base portions thereof as the fulcrums. Additionally, the contacting portions 42 and 43 push, through the elastic forces thereof, the tip ends thereof against the conductive patterns 92.

As illustrated in FIGS. 4-5, the base portions of the inner contacting portions 42 extend somewhat to the outside from the upper edge of the cutouts 41c of the cylindrical main body 41, and then are bent back toward the inside at bending portions 42a. Moreover, the inner contacting portions 42 extend to the inside from the bending portions 42a, to position the tip ends of the inner contacting portions 42 within the cylindrical main body 41. Having the inner contacting portions 42 have the bending portions 42a makes it possible to increase the overall length of the inner contacting portions 42 while reducing the length of the part 42b that is positioned on the inside of the cylindrical main body 41.

Additionally, the base portions of the outer contacting portions 43 extend toward the inside from the upper edges of the cutouts 41c of the cylindrical main body 41, after which they are bent back to the outside at bending portions 43a. Moreover, the outer contacting portions 43 extend further to the outside from the bending portions 43a, so that the tip ends of the outer contacting portions 43 will be in positions that are to the outside of the cylindrical main body 41. The outer contacting portions 43 having the bending portions 43a in this way makes it possible to increase the overall length of the outer contacting portions 43 while reducing the length of the portions 43b of the outer contacting portions 43 that are positioned to the outside of the cylindrical main body 41.

As described above, the signal terminal 3 has, at the bottom portion thereof, a contacting portion 33 that extends in the downward oblique direction. As illustrated in FIG. 5, the contacting portion 33 is positioned on the opposite side from the inner contacting portion 42, with a plane P2 that is perpendicular to the direction in which the plurality of ground terminals 4 are lined up. Additionally, the contacting portion 33 extends toward the second half cylinder portion 41b (which in this case, is toward the left) whereon the outer contacting portion 43 is formed, in the plan view of the connector 1. Furthermore, the center of the width of the contacting portion 33 is positioned on a plane P1 that is parallel to the direction in which the ground terminals 4 are lined up and that includes the center line C of the cylindrical main body 41.

Figure 9:
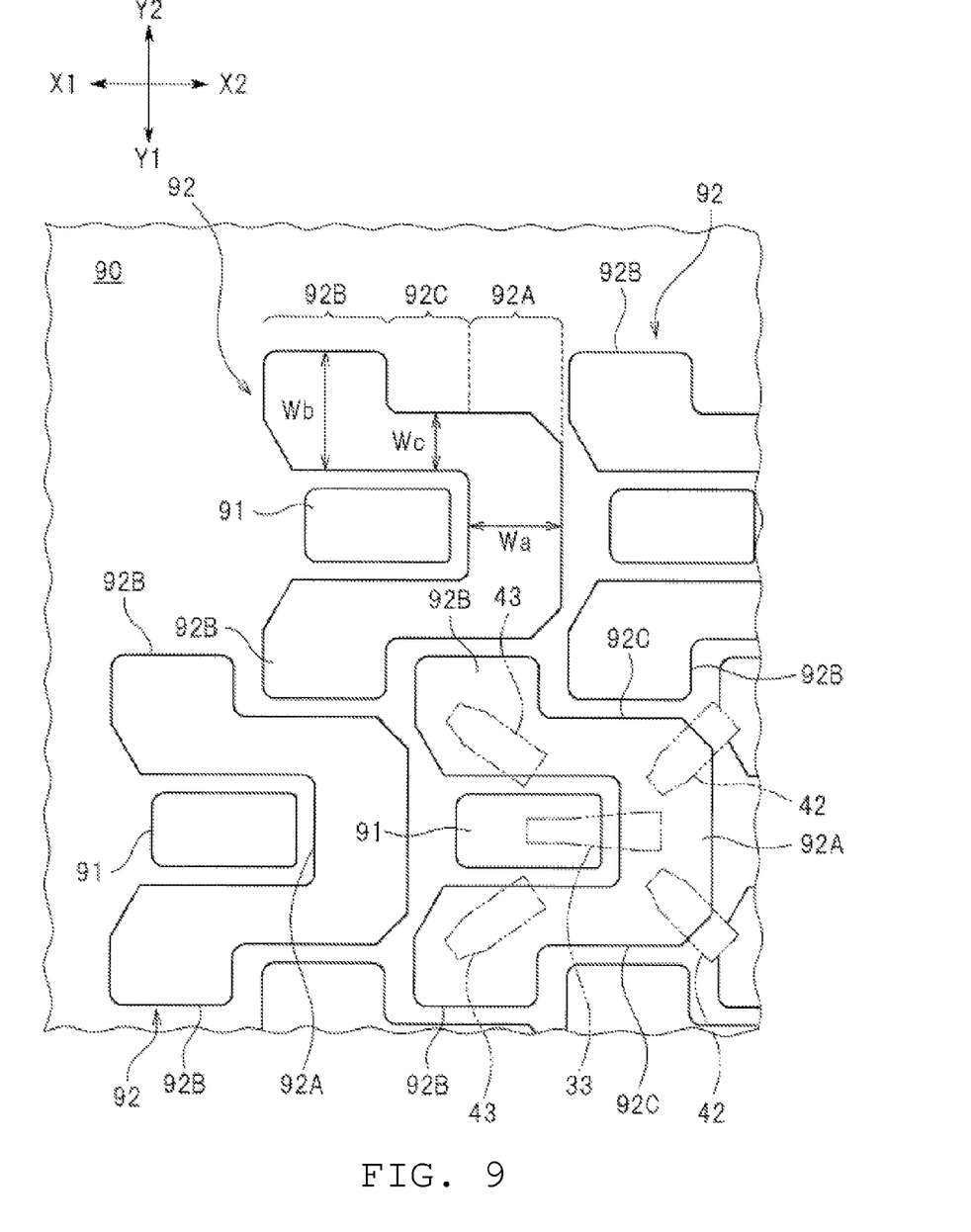
FIG. 9 is a plan view of the circuit board of FIG. 6.

As described above, a plurality of conductive patterns 92 for grounds and a plurality of conductive patterns 91 for signal transmission are formed on the surface of the circuit board 90. As illustrated in FIG. 9, the plurality of conductive patterns 91 and 92 is lined up in the left/right direction, in a plurality of rows.

The conductive pattern 91 is positioned below the contacting portion 33 of the signal terminal 3. In this example, the conductive pattern 91 is a rectangle that is long in the left/right direction, which extends in the direction of extension of the contacting portion 33 (which in this case is the left direction) from the position under the signal terminal main body 31.

The conductive pattern 92 is formed in an essentially U shape, and surrounds the conductive pattern 91. The conductive pattern 92, in the plan view of the circuit board 90 and the connector 1, is open facing the first half cylinder portion 41A of the adjacent ground terminal 4; which, in this case, is to the left (see FIG. 6).

All of the inner contacting portions 42 and the outer contacting portions 43 of the individual ground terminals 4 make contact with the individual conductive patterns 92. In detail, the conductive pattern 92 has a first contacting region 92A that extends in the forward/backward direction and which is contacted by the two inner contacting portions 42; a second contacting region 92B that extends in the forward/backward direction and which is contacted by the two outer contacting portions 43, positioned mutually separated in the forward/backward direction; and two connecting regions 92C for connecting the first contacting regions 92A and the second contacting regions 92B. The signal transmission conductive pattern 91 is positioned between the two connecting regions 92 C. Moreover, the conductive pattern 92 is formed in an essentially U shape facing the first contacting region 92A of the adjacent conductive pattern 92. Because of this, the conductive pattern 91 is enclosed by the conductive pattern 92 and the first contacting region 92A of the adjacent conductive pattern 92.

The width Wa of the first contacting region 92A is larger than the width Wc of the connecting region 92C. In the step for attaching the connector 1 to the circuit board 90, the tip ends of the inner contacting portions 42 contact the first contacting region 92A, and then proceed toward the inside while sliding on the first contacting region 92A.

The two second contacting regions 92B each expand toward the front (the direction indicated by Y1) and toward the rear (the direction indicated by Y2) from the connecting region 92C. That is, the width Wb of the second contacting region 92B is larger than the width Wc of the connecting region 92C. In the step for attaching the connector 1 to the circuit board 90, the tip ends of the outer contacting portions 43, after contacting the second contacting region 92B, expand toward the outside while sliding on the second contacting region 92B.

The second contacting regions 92B of the conductive patterns 92 in two adjacent rows are lined up alternatingly in the left/right direction. That is, the second contacting region 92B is positioned between the second contacting regions 92B of two conductive patterns 92 in the adjacent row. As a result, it is possible to have the plurality of conductive patterns 92 be mutually adjacent, and to secure a broad second contacting region 92B.

Figure 10:
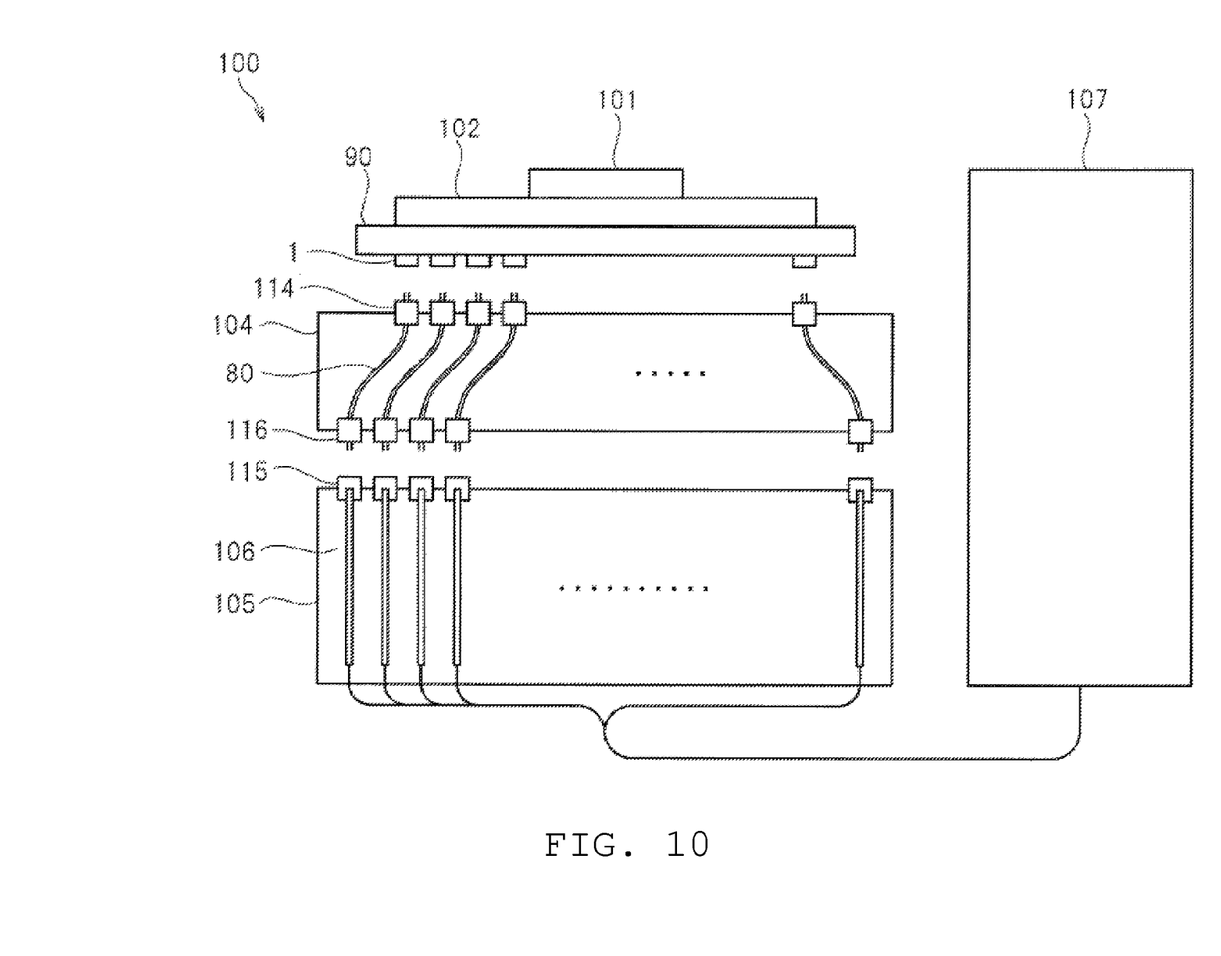
FIG. 10 is a schematic diagram of a semiconductor testing device provided with the connector of FIG. 1 and the circuit board of FIG. 6.

A semiconductor 101, as the object to be tested, is mounted in a device socket 102 that is disposed on the circuit board 90. A plurality of conductive patterns 91 and 92, described above, is formed on the bottom surface of the circuit board 90. A plurality of connectors 1 is connected, through rivets, screws, or other securing hardware, to the bottom surface of the circuit board 90. The signal terminal 3 of each connector 1 is connected electrically to the semiconductor 101 this through the conductive pattern 91 and the device socket 102.

The semiconductor testing device 100 is provided with a motherboard 104 that includes a plurality of coaxial cables 80. A plurality of holders 114 is provided in the top portion of the motherboard 104. Each holder 114 holds a signal terminal 81 and a shield terminal 82 of the coaxial cable 80.

When the circuit board 90 is positioned over the motherboard 104, a plurality of signal terminals 81 and shield terminals 82 is inserted into the connector 1. A plurality of holders 116 is positioned at the bottom portion of the motherboard 104. The individual holders 116 retain the terminals that are provided at the bottom edge of the coaxial cable 80.

The semiconductor testing device 100 is provided with a test head 105 having a plurality of testing modules 106. A connector 115 is attached to the edge of each testing module 106, and when the motherboard 104 is positioned on the test head 105, the terminals that are provided at the bottom end of the coaxial cable 80 are inserted into the individual connectors 115. The individual testing modules 106 are connected to the testing device main body 107, where testing signals are produced in accordance with instructions received from the testing device main body 107, and are outputted to the semiconductor 101.

As described above, the ground terminals 4 of the connectors 1 have a plurality of inner contacting portions 42 and outer contacting portions 43 that extended downward from the cylindrical main body 41. The inner contacting portions 42 extend toward the inside of the cylindrical main body 41 in the downward direction, and the outer contacting portions 43 extend toward the outside of the cylindrical main body 41 in the downward direction. Because of this, there are no interferences produced between the contacting portions 42 and 43, making design of the terminals easy. Furthermore, because a plurality of contacting portions 42 and 43 can be provided in the ground terminal 4, these can be disposed encompassing the signal terminal 3. The result is the ability to suppress the occurrence of impedance mismatch and crosstalk.

Note that the Present Disclosure is not limited to the connector 1 set forth above, but rather can be varied in a variety of ways. For example, in the connector 1, two inner contacting portions 42 and two outer contacting portions 43 were provided in the ground terminal 4. However, the number of contacting portions provided in the ground terminal 4 is not limited thereto. For example, two outer contacting portions 43 and only one inner contacting portion 42 may be provided in the ground terminal 42. Conversely, only one outer contacting portion 43 and two inner contacting portions 42 may be provided in the ground terminal 4. Conversely, is also acceptable to have only one outer contacting portion 43 and one inner contacting portion 42 in the ground terminal 4. Furthermore, in the connector 1, the cylindrical main body 41 of the ground terminal 4 had a ring-shaped cross section. However, the shape of the cylindrical main body 41 is not limited thereto, and instead, for example, the cylindrical main body 41 may have an octagonal cross-sectional shape. Moreover, in the explanation above, the inner contacting portions 42 and the outer contacting portions 43 were disposed at roughly equally-spaced intervals. However, the inner contacting portions 42 and the outer contacting portions 43 need not necessarily be disposed at equally-spaced intervals.

While a preferred embodiment of the Present Disclosure is shown and described, it is envisioned that those skilled in the art may devise various modifications without departing from the spirit and scope of the foregoing Description and the appended Claims.

What is claimed is:
1. A connector, the connector comprising:
   a plurality of ground terminals, each ground terminal including a cylindrical main body, the main body being disposed on a circuit board so that the axes of the main bodies are perpendicular relative to the circuit board; and
   a plurality of signal terminals, the signal terminals being disposed on the inside of respective main bodies;
   wherein:
      each ground terminal includes a plurality of ground terminal contacting portions for contacting the circuit board, the ground terminal contacting portions extending from the bottom edges of the main bodies;
      each of the plurality of ground terminal contacting portions includes an inner contacting portion and an outer contacting portion, a tip end of the inner contacting portion extending toward the inside of the cylindrical main body in the downward direction, a tip end of the outer contacting portion extending toward the outside of the cylindrical main body in the downward direction;
      the inner contacting portions and the outer contacting portions are positioned on mutually-opposing halves of the respective cylindrical main body;
      each signal terminal includes, on the bottom edge thereof, a signal terminal contacting portion adapted to contact the circuit board; and
      each signal terminal contacting portion comprises a plate-shaped spring that extends obliquely in the downward direction to be positioned on the opposite half from the respective inner contacting portions.

2. The connector of claim 1, wherein each outer contacting portion is disposed within a second half of the main body.

3. The connector of claim 2, wherein each ground terminal contacting portion includes two outer contacting portions.

4. The connector of claim 3, wherein each inner contacting portion is disposed within a first half of the main body.

5. The connector of claim 4, wherein each ground terminal contacting portion includes two inner contacting portions.

6. The connector of claim 5, wherein the inner contacting portions and the outer contacting portions encompass the signal terminal.

7. A semiconductor testing device, the semiconductor testing device comprising:
   a connector, the connector including:
      a plurality of ground terminals, each ground terminal including a cylindrical main body, the main body being disposed on a circuit board so that the axes of the main bodies are perpendicular relative to the circuit board; and
      a plurality of signal terminals, the signal terminals being disposed on the inside of respective main bodies;
   wherein:
      each ground terminal includes a plurality of ground terminal contacting portions for contacting the circuit board, the ground terminal contacting portions extending from the bottom edges of the main bodies; and
      each of the plurality of ground terminal contacting portions includes an inner contacting portion and an outer contacting portion, a tip end of the inner contacting portion extending toward the inside of the cylindrical main body in the downward direction, a tip end of the outer contacting portion extending toward the outside of the cylindrical main body in the downward direction;

the inner contacting portions and the outer contacting portions of each ground terminal are positioned on mutually-opposing halves of that cylindrical main body;

each signal terminal includes, on the bottom edge thereof, a signal terminal contacting portion adapted to contact the circuit board; and each signal terminal contacting portion comprises a plate-shaped spring that extends obliquely in the downward direction to be positioned on the opposite half of that cylindrical main body from the inner contacting portions.

8. The semiconductor testing device of claim 7, wherein each ground terminal includes two inner contacting portions and two outer contacting portions.

9. The semiconductor testing device of claim 8, wherein a conductive pattern for contact by the signal terminal contacting portion, and a conductive pattern for contacting the outer contacting portions and the inner contacting portions, are formed on the surface of the circuit board.

10. The semiconductor testing device of claim 9, wherein the conductive pattern for contacting the outer contacting portions and the inner contacting portions encompass the signal conductive pattern.

11. The semiconductor testing device of claim 10, wherein the outer contacting portions radially extends from the main body so as to contact the conductive pattern for contacting the outer contacting portions and the inner contacting portions.

12. The semiconductor testing device of claim 11, wherein the outer contacting portions do not contact the conductive pattern for contact by the signal terminal contacting portion.

13. The connector of claim 6, wherein the ground terminal outer contacting portion extends radially away from the main body.

14. The connector of claim 13, wherein a conductive pattern for contact by the signal terminal contacting portion, and a conductive pattern for contacting the outer contacting portions and the inner contacting portions, are formed on the surface of the circuit board, and the conductive pattern for contacting the outer contacting portions and the inner contacting portions encompass the signal conductive pattern.

15. The connector of claim 14, wherein the outer contacting portions radially extends from the main body so as to contact the conductive pattern for contacting the outer contacting portions and the inner contacting portions.

16. The connector of claim 15, wherein the outer contacting portions do not contact the conductive pattern for contact by the signal terminal contacting portion.

17. The semiconductor testing device of claim 7, wherein the signal terminal is electrically connected to a semiconductor device.

18. The connector of claim 1, wherein the ground terminal contacting portions extend from top edges of cutouts formed on the bottom edges of the main bodies, the cutouts extending in an upward direction from the bottom edges of the main bodies.

* * * * *